(12) United States Patent
Zhang

(10) Patent No.: US 10,186,561 B2
(45) Date of Patent: Jan. 22, 2019

(54) ARRAY SUBSTRATE AND MANUFACTURING METHOD THEREOF AND ORGANIC LIGHT-EMITTING DISPLAY APPARATUS

(71) Applicant: BOE Technology Group Co., Ltd., Beijing (CN)

(72) Inventor: Peng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/510,918

(22) PCT Filed: Mar. 3, 2016

(86) PCT No.: PCT/CN2016/075423
§ 371 (c)(1),
(2) Date: Mar. 13, 2017

(87) PCT Pub. No.: WO2016/155456
PCT Pub. Date: Oct. 6, 2016

(65) Prior Publication Data
US 2017/0278913 A1 Sep. 28, 2017

(30) Foreign Application Priority Data

Mar. 27, 2015 (CN) .......................... 2015 1 0142503

(51) Int. Cl.
*H01L 27/32* (2006.01)
*H01L 51/52* (2006.01)
(Continued)

(52) U.S. Cl.
CPC ...... *H01L 27/3246* (2013.01); *H01L 27/3248* (2013.01); *H01L 27/3258* (2013.01);
(Continued)

(58) Field of Classification Search
CPC ............. H01L 27/3246; H01L 51/5265; H01L 27/3248; H01L 27/3258; H01L 51/56; H01L 2251/5315; H01L 2227/323
See application file for complete search history.

(56) References Cited

U.S. PATENT DOCUMENTS

| 9,368,521 B2 | 6/2016 | Moriwaki |
| 2011/0121272 A1 | 5/2011 | Lee et al. |

(Continued)

FOREIGN PATENT DOCUMENTS

| CN | 102017800 A | 4/2011 |
| CN | 103943787 A | 7/2014 |

(Continued)

OTHER PUBLICATIONS

International Search Report (English translation) and Written Opinion of International Application No. PCT/CN2016/075423, dated Jun. 13, 2016, 7 pages.

(Continued)

*Primary Examiner* — Mamadou Diallo
(74) *Attorney, Agent, or Firm* — Westman, Champlin & Koehler, P.A.

(57) ABSTRACT

The present disclosure provides an array substrate and a manufacturing method thereof and an organic light-emitting display apparatus. The array substrate comprises a plurality of sub-pixel zones, each of which comprising a light-emitting unit provided above a base substrate, wherein the light-emitting unit is formed to comprise a concave or convex structure, so that the light-emitting area of the light-emitting unit is greater than the projected area of the light-emitting unit onto the base substrate. Compared to the prior art, the present disclosure can increase the amount of (Continued)

light emission in each sub-pixel zone, so that the view angle of the display may be increased and the display effect may be improved.

4 Claims, 1 Drawing Sheet

(51) Int. Cl.
*H01L 51/56* (2006.01)
*H01L 51/50* (2006.01)
(52) U.S. Cl.
CPC ...... *H01L 51/5012* (2013.01); *H01L 51/5209* (2013.01); *H01L 51/5262* (2013.01); *H01L 51/5265* (2013.01); *H01L 51/56* (2013.01); *H01L 2227/323* (2013.01); *H01L 2251/5315* (2013.01)

(56) References Cited

U.S. PATENT DOCUMENTS

| | | |
|---|---|---|
| 2011/0297943 A1 | 12/2011 | Kim et al. |
| 2013/0001533 A1 | 1/2013 | Kim et al. |
| 2013/0099258 A1 | 4/2013 | Lim et al. |
| 2015/0206928 A1* | 7/2015 | Kimura ............... H01L 27/3246 257/88 |
| 2016/0064462 A1* | 3/2016 | Yoon ................... H01L 27/1255 257/40 |
| 2016/0254333 A1 | 9/2016 | Zhang |

FOREIGN PATENT DOCUMENTS

| | | | |
|---|---|---|---|
| CN | 104362257 A | 2/2015 | |
| CN | 104425542 A | 3/2015 | |
| CN | 104716164 A | 6/2015 | |
| KR | 1020070056566 A * | 6/2007 | ............. H05B 33/22 |
| WO | 2014/084130 A1 | 6/2014 | |

OTHER PUBLICATIONS

English translation of Box No. V of the Written Opinion for the International Searching Authority for International Application No. PCT/CN2016/075423, 2 pages.
First Chinese Office Action, including Search Report, for Chinese Patent Application No. 201510142503.7, dated Mar. 3, 2017, 16 pages.
Third Office Action, including Search Report, for Chinese Patent Application No. 201510142503.7, dated Apr. 28, 2018, 13 pages.

* cited by examiner

ARRAY SUBSTRATE AND MANUFACTURING METHOD THEREOF AND ORGANIC LIGHT-EMITTING DISPLAY APPARATUS

CROSS-REFERENCE TO RELATED APPLICATION

This Application is a Section 371 National Stage Application of International Application No. PCT/CN2016/075423, filed 3 Mar. 2016 and published as WO 2016/155456 A1 on 6 Oct. 2016, in Chinese, which claims priority to Chinese Patent Application No. 201510142503.7, filed on 27 Mar. 2015, in the State Intellectual Property Office, the contents of which are hereby incorporated by reference in their entirety.

TECHNICAL FIELD

The present disclosure relates to the field of display technology, particularly to an array substrate and a manufacturing method thereof and an organic light-emitting display apparatus.

BACKGROUND ART

In recent years, organic light-emitting diode (OLED) display panels have become novel flat display panels which are popular at home and abroad. Compared to LCD panels as the mainstream of flat display panels, OLED display panels have intrinsic advantages, such as self-luminescence, wide view angle, short response time, wide gamut, low working voltage, thin panel, easiness of being made into a flexible panel, wide range of working temperature.

However, there will be a microcavity effect more or less, whether in a top emission type OLED display panel or in a bottom emission type OLED display panel. The microcavity effect mainly means that photon densities of different energy states are redistributed such that only the light having a specific wavelength is emitted at a specific angle after complying with the resonant cavity mode. As for a top emission type OLED display panel, the anode close to the base substrate has a very high reflectance, and the cathode away from the base substrate typically uses a semitransparent metal structure, which may also increase the reflection of light. Therefore, the interference of multiple photon beams will be formed between the anode and the cathode, such that the microcavity effect is more remarkable. In a top emission type OLED display panel in the prior art as shown in FIG. 1, a light-emitting unit 20 comprises a first electrode 21, a light-emitting layer 22, and a second electrode 23, which are sequentially provided above a base substrate 10. A microcavity is composed of the first electrode 21, the light-emitting layer 22, and the second electrode 23. The emergence direction of the light beam is perpendicular to the interface between the first electrode 21 and the light-emitting layer 22 and the interface between the light-emitting layer 22 and the second electrode 23. This results in problems, such as narrow view angle, different light intensities seen at different observation angles, and relatively small light-emitting area.

SUMMARY

An object of this disclosure is to provide an array substrate and a manufacturing method thereof and an organic light-emitting display apparatus, so as to increase the amount of light emission of each sub-pixel zone and improve the display effect.

In order to achieve the object described above, this disclosure provides an array substrate, comprising a plurality of sub-pixel zones, each of which comprises a light-emitting unit provided above a base substrate, wherein the light-emitting unit is formed to comprise a concave or convex structure, so that the light-emitting area of the light-emitting unit to be greater than the projected area of the light-emitting unit onto the base substrate.

Preferably, a planarizing layer is provided between the light-emitting unit and the base substrate, a recess is formed on a surface of the planarizing layer facing towards the light-emitting unit, and the light-emitting unit is formed by covering the surface of the recess.

Preferably, the recess comprises an inclined side surface and a bottom surface, and the area of the bottom surface is less than the area of the opening of the recess.

Preferably, an intersection angle between the side surface and the bottom surface of the recess is in a range of 130°-140°.

Preferably, a portion of the planarizing layer located around the recess has a thickness in a range of 5-7 μm.

Preferably, the light-emitting unit comprises a first electrode, a light-emitting layer, and a second electrode, which are sequentially provided on the planarizing layer, and the first electrode comprises an opaque metal layer and the second electrode is a semitransparent metal layer.

Preferably, a driver thin film transistor is further provided between the base substrate and the planarizing layer, a via hole is provided in a position of the planarizing layer corresponding to a drain electrode of the driver thin film transistor, and the first electrode is connected to the drain electrode through the via hole.

Accordingly, the present disclosure further provides a manufacturing method of an array substrate comprising a plurality of sub-pixel zones, wherein the manufacturing method comprises:

forming a light-emitting unit in each of the sub-pixel zones, wherein the light-emitting unit is formed to comprise a concave or convex structure, so that the light-emitting area of the light-emitting unit to be greater than the projected area of the light-emitting unit onto the base substrate.

Preferably, the manufacturing method further comprises steps performed before the step of forming a light-emitting unit in each of the sub-pixel zones:

forming a planarizing layer; and forming a recess in a portion on the planarizing layer corresponding to the light-emitting unit.

Preferably, the step of forming a recess in a portion on the planarizing layer corresponding to the light-emitting unit comprises:

exposing and developing of the planarizing layer by using a half-tone mask plate, wherein the half-tone mask plate comprises a fully light-transmitting zone, a partially light-transmitting zone, and an opaque zone, and the fully light-transmitting zone corresponds to the middle part of the light-emitting unit, the partially light-transmitting zone corresponds to the peripheral zone of the middle part of the light-emitting unit, and the opaque zone corresponds to the zone where the light-emitting unit is not provided.

Preferably, a portion of the planarizing layer located around the recess has a thickness in a range of 5-7 μm.

Preferably, the step of forming a light-emitting unit in each of the sub-pixel zones comprises:

sequentially forming a first electrode, a light-emitting layer, and a second electrode on the surface of the recess on the planarizing layer, wherein the first electrode comprises an opaque metal layer and the second electrode is a semitransparent metal layer.

Preferably, the manufacturing method further comprises a step performed before the step of forming a planarizing layer above a base substrate:

forming a driver thin film transistor;

the manufacturing method further comprises a step performed after the step of forming a planarizing layer above a base substrate:

forming a via hole in a position of the planarizing layer corresponding to a drain electrode of the driver thin film transistor, so that the first electrode is connected to the drain electrode through the via hole.

Correspondingly, the present disclosure further provides an organic light-emitting display apparatus, wherein the organic light-emitting display apparatus comprises the above array substrate provided by this disclosure.

The light-emitting area of the light-emitting unit in this disclosure is greater than the projected area of the light-emitting unit onto the base substrate. Thus, in the case that the sub-pixel zone is restricted, the light-emitting area of the light-emitting unit in this disclosure is increased with respect to the light-emitting area of the light-emitting unit in the prior art, and the amount of light emission is more. Furthermore, light beams are allowed to emerge towards a plurality of directions by forming the light-emitting unit on the surface of the recess of the planarizing layer, such that the view angle of the display can be increased and in turn the intensities and the colors of light observed at different angles are more uniform, and the display effect is improved.

BRIEF DESCRIPTION OF THE DRAWINGS

The accompanying drawings are intended to provide further understanding of this disclosure, constitute a part of the specification, and are used for explaining this disclosure together with particular embodiments below. However, it does not constitute the limitation of this disclosure. In the drawing.

REFERENCE NUMERALS

10. base substrate; 20. light-emitting unit; 21. first electrode; 22. light-emitting layer; 23. second electrode; 30. planarizing layer; 40. driver thin film transistor; 41. drain electrode; 42. active layer; 43. first insulating layer; 44. gate electrode; 45. second insulating layer; 46. source electrode; 50. pixel defining layer.

DESCRIPTION OF EMBODIMENTS

Particular embodiments of this disclosure are illustrated in detail below in conjunction with the accompanying drawing. It is to be understood that particular embodiments described hereby are provided to illustrate and explain this disclosure only, but are not intended to limit this disclosure.

Figure 1:
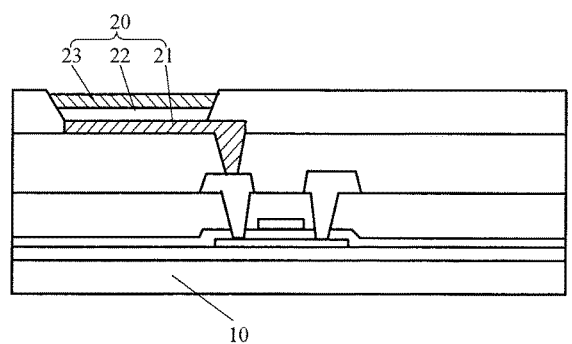
FIG. 1 is a structural schematic diagram of an array substrate in the prior art.
Figure 2:
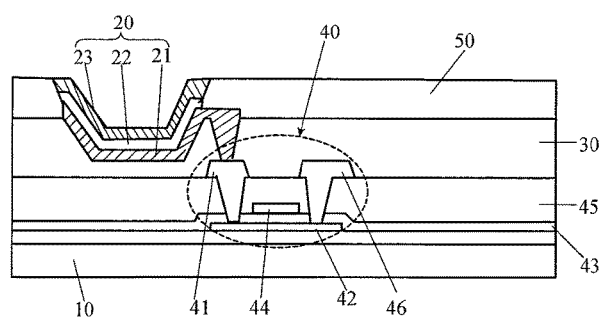
FIG. 2 is a structural schematic diagram of an array substrate in an embodiment of the invention.

As an aspect of this invention, there is provided an array substrate, as shown in FIG. 2, comprising a plurality of sub-pixel zones, each of which comprises a light-emitting unit 20 provided above a base substrate 10, wherein the light-emitting unit 20 is formed to comprise a concave or convex structure, so that the light-emitting area of the light-emitting unit 20 is greater than the projected area of the light-emitting unit 20 onto the base substrate 10.

In the prior art, a light-emitting unit of an organic electroluminescent array substrate is formed as a flat structure and is provided in relatively parallel to a base substrate 10, and thus the light-emitting area of the light-emitting unit 20 equals to the projected area of the light-emitting unit 20 onto the base substrate 10. In this disclosure, the light-emitting unit 20 is formed to comprise a concave or convex structure, such that the light-emitting area of the light-emitting unit 20 is greater than the projected area of the light-emitting unit 20 onto the base substrate 10. Therefore, in the case that the sub-pixel zone is restricted, compared to the prior art, the array substrate of this disclosure has a larger light-emitting area and a larger amount of light emission, such that the display effect of the display apparatus may be improved.

As a specific embodiment of this invention, as shown in FIG. 2, a planarizing layer 30 is provided between the light-emitting unit 20 and the base substrate 10, a recess is formed on a surface of the planarizing layer 30 facing towards the light-emitting unit 20, and the light-emitting unit 20 is formed by covering the surface of the recess. The light-emitting unit 20 may comprise a first electrode 21, a light-emitting layer 22, and a second electrode 23, which are sequentially provided. The light-emitting unit 20 being formed by covering the surface of the recess can be understood as that the shapes of the first electrode 21, the light-emitting layer 22, and the second electrode 23 are consistent with the surface of the recess, such that the light-emitting area of the light-emitting unit 20 is increased. In the light-emitting unit 20 in the prior art, the interface between the first electrode and the light-emitting layer and the interface between the light-emitting layer and the second electrode are both planes, such that the light beam emitted from the light-emitting layer emerges perpendicular to the interface between the first electrode and the light-emitting layer and the interface between the light-emitting layer and the second electrode. Particularly, when the first electrode is an opaque material, the light beam is further reflected in the direction perpendicular to the interface between the first electrode and the light-emitting layer and the interface between the light-emitting layer and the second electrode. However, in this disclosure, the light-emitting unit 20 is formed by covering the surface of the recess, such that the interface between the first electrode and the light-emitting layer and the interface between the light-emitting layer and the second electrode are formed as a curved shape. Therefore, the interference of multiple photon beams in a plurality of directions may be formed between the first electrode and the second electrode by the light beam emitted from the light-emitting layer 22, such that the light beam can emerge at different angles. The view angle of the display is thereby increased, and in turn the intensities and the colors of light observed at different angles are more uniform.

In this invention, the shape of the recess is not particularly limited, as long as the light beam of the light-emitting unit 20 can emerge towards different directions. As a specific embodiment of this invention, the recess comprises an inclined side surface and a bottom surface, and the area of the bottom surface is less than the area of the opening of the recess. When the light-emitting unit 20 is formed by covering the surface of the recess, the light beam emitted from the portion corresponding to the inclined side surface of the recess is perpendicular to this inclined side surface, and the light beam emitted from the portion corresponding to the bottom surface of the recess is perpendicular to this bottom surface. Preferably, an intersection angle between the side surface and the bottom surface is in a range of 130°-140°, for example 135°. When an intersection angle between the side surface and the bottom surface is in a range of 130°-140°, the light-emitting area may be maximally increased while the light beam of the light-emitting unit 20 emitted from the portion corresponding to each side surface is prevented from being blocked by the portion corresponding to the opposite side surface.

Figure 3:
FIG. 3 is a structural schematic diagram of a recess on the planarizing layer in an embodiment of the invention.

In order to increase the area of the surface of the recess, the material for forming the planarizing layer may have a relatively large thickness. Specifically, a portion of the planarizing layer located around the recess has a thickness between 5-7 µm. When the recess comprises an inclined side surface and a bottom surface and the area of the bottom surface is less than the area of the opening, the increase of the thickness of the planarizing layer may increase the area of the inclined side surface. For example, as shown in FIG. 3, when a portion of the planarizing layer located around the recess has a thickness H of 6 µm, the depth h of the recess may be 4.5 µm and the angle α between the side surface and the bottom surface of the recess may be 135°. At this time, the width d1 of the side surface of the recess is about 6.4 µm, and the width d2 of the projection of the side surface of the recess onto the base substrate is 4.5 µm. Thus, the light-emitting zone of the array substrate in this example has a width greater than that in the prior art by about (6.4-4.5)*2=3.8 µm, and the area of the light-emitting zone of the display is thereby increased.

As described hereinbefore, the light-emitting unit 20 may comprise a first electrode 21, a light-emitting layer 22, and a second electrode 23, which are sequentially provided on the planarizing layer 30, and when the first electrode 21 is an opaque metal layer and the second electrode 23 is a semitransparent metal layer, the second electrode 23 would increase the reflection of light, so that the microcavity effect is more remarkable.

Specifically, the first electrode may be an anode and the second electrode may be a cathode. When a working voltage is applied to the anode and the cathode, holes in the anode and electrons in the cathode are both injected into the light-emitting layer 22. Electron-hole pairs are formed of holes and electrons while energy is released and emitted in the form of light, which exhibits different colors by passing through different light-emitting molecules and is then uniformly emitted from both sides of the light-emitting layer 22. As for a top emission type light-emitting unit, the microcavity effect is more remarkable due to the reflection function of the second electrode. Therefore, the present invention is particularly suitable for top emission type light-emitting units. That is, the first electrode 21 comprises an opaque metal layer and the second electrode 23 comprises a semitransparent metal layer.

Specifically, the first electrode 21 may comprise two indium tin oxide films and an opaque metal layer between the two indium tin oxide films, and the second electrode 23 is a semitransparent metal thin film.

Furthermore, as shown in FIG. 2, a driver thin film transistor 40 is further provided between the base substrate 10 and the planarizing layer 30, a via hole is provided in a position of the planarizing layer 30 corresponding to a drain electrode 41 of the driver thin film transistor 40, and the first electrode 21 is connected to the drain electrode 41 through the via hole. The driver thin film transistor 40 may be a bottom gate type thin film transistor or a top gate type thin film transistor (as shown in FIG. 2), and it is not specifically defined herein.

As shown in FIG. 2, a pixel defining layer 50 is further provided around each of the light-emitting units 20 to separate the light-emitting units in adjacent sub-pixel zones.

As another aspect of this invention, there is provided a manufacturing method of an array substrate comprising a plurality of sub-pixel zones, wherein the manufacturing method comprises:

forming a light-emitting unit in each of the sub-pixel zones, wherein the light-emitting unit is formed to comprise a concave or convex structure, so that the light-emitting area of the light-emitting unit is greater than the projected area of the light-emitting unit onto the base substrate.

As a specific embodiment of this invention, specifically, the manufacturing method further comprises steps performed before the step of forming a light-emitting unit in each of the sub-pixel zones:

forming a planarizing layer on the base substrate, wherein the planarizing layer may be formed as a polyimide adhesive (PI) layer in manner of thermal vapor deposition; and forming a recess in a portion on the planarizing layer corresponding to the light-emitting unit, so that the light-emitting unit is formed by covering the surface of the recess, and thereby the light-emitting area of the light-emitting unit is greater than the projected area of the light-emitting unit onto the base substrate.

As described hereinbefore, the recess may comprise an inclined side surface and a bottom surface, and the area of the bottom surface is less than the area of the opening of the recess. Specifically, the step of forming a recess in a portion on the planarizing layer corresponding to the light-emitting unit comprises:

exposing and developing the planarizing layer by using a half-tone mask plate, wherein the half-tone mask plate comprises a fully light-transmitting zone, a partially light-transmitting zone, and an opaque zone when a positive photoresist is used, and the fully light-transmitting zone corresponds to the middle part of the light-emitting unit, the partially light-transmitting zone corresponds to the peripheral zone of the middle part of the light-emitting unit, and the opaque zone corresponds to an zone where the light-emitting unit is not provided.

The middle part of the light-emitting unit corresponds to the bottom surface of the recess to be formed, and may also be regarded as the middle part of the sub-pixel zone. For example, the size of the sub-pixel zone is 25 µm*30 µm, a portion of the planarizing layer corresponding to the middle part of the light-emitting unit may correspond to a zone of 15 µm*20 µm in the middle part of this sub-pixel zone. In the case of using positive photoresist, when the planarizing layer is exposed, the fully light-transmitting zone of the half-tone mask plate corresponds to the middle part of the sub-pixel zone. The light transmittance of the partially light-transmitting zone may be reduced gradually from the interior (close to the fully light-transmitting zone) to the exterior (close to the opaque zone), so that the denaturation degree of the photoresist in the position of the middle part of the sub-pixel zone is relatively large and the denaturation degree of the photoresist in the peripheral zone of the middle part is gradually reduced. The recess is then formed on the planarizing layer by development.

Of course, the recess may also be formed in other ways, and it is not particularly limited herein.

In order to allow the light-emitting area of the light-emitting unit to be greater than the projected area of the light-emitting unit onto the base substrate as possible, the thickness of the planarizing layer may be relatively large. Specifically, a portion of the planarizing layer located around the recess may have a thickness in a range of 5-7 μm. Therefore, a relatively deep recess may be formed on the planarizing layer so as to increase the light-emitting area of the light-emitting unit as possible and reduce the influence on the thickness of the array substrate, which is favorable to the thinned-shape design of the display apparatus.

Furthermore, the step of forming a light-emitting unit in each of the sub-pixel zones may comprise:

sequentially forming a first electrode, a light-emitting layer, and a second electrode on the surface of the recess on the planarizing layer;

wherein the first electrode comprises an opaque metal layer and the second electrode is a semitransparent metal layer.

Furthermore, the manufacturing method further comprises a step performed before the step of forming a planarizing layer above a base substrate:

forming a driver thin film transistor;

the manufacturing method further comprises a step performed after the step of forming a planarizing layer above a base substrate:

forming a via hole in a position of the planarizing layer corresponding to a drain electrode of the driver thin film transistor, so that the first electrode is connected to the drain electrode through the via hole.

The form of the driver thin film transistor is not particularly limited in this invention, and it may be a top gate type thin film transistor or a bottom gate type thin film transistor. Concerning the driver thin film transistor 40 shown in FIG. 2, as an example, it is possible that an active layer material is first deposited on a base substrate 10, and a pattern comprising an active layer 42 is formed by a photolithographic patterning process; a first insulating layer 43 is then formed on the base substrate formed with the active layer 42; a gate electrode metal layer is further formed on the first insulating layer 43, and a pattern comprising a gate electrode 44 is formed by a photolithographic patterning process; thereafter a second insulating layer 45 is formed, and two via holes penetrating the first insulating layer 43 and the second insulating layer 45 are formed, so that a source and drain metal layers subsequently formed on the second insulating layer 45 are connected to the active layer 42 through these two via holes; and finally a pattern of a source electrode 46 and a drain electrode 41 is formed.

As yet another aspect of this invention, there is provided an organic light-emitting display apparatus, and this organic light-emitting display apparatus comprises the array substrate described above. Since the light-emitting area of the light-emitting unit on the array substrate in this invention has been increased with respect to that in the prior art and the emergence angle of the light beam is wider, light intensities from different angles have relatively small differences and the display effect is improved when the organic light-emitting display apparatus performs image display.

Those described above are the description of the array substrate and the manufacturing method thereof and the display apparatus provided by this disclosure. As can be seen, in the case that the sub-pixel zone is restricted, the light-emitting area of the light-emitting unit in this invention is greater than the light-emitting area of the light-emitting unit in the prior art. Furthermore, light beams are allowed to emerge towards a plurality of directions by forming the light-emitting unit on the surface of the recess of the planarizing layer, such that the view angle of the display can be increased and in turn the intensities and the colors of light observed at different angles are more uniform, and the display effect is improved.

Although the description is made by exemplifying the light-emitting unit being formed as a structure comprising a recess in embodiments described above, the present invention is not limited thereto. The light-emitting unit may also be formed to comprise a convex structure, as long as the light-emitting area of the light-emitting unit is greater than the projected area of the light-emitting unit onto the base substrate.

It can be understood that the above embodiments are merely exemplary embodiments used for illustrating the principle of this invention. However, this invention is not limited thereto. With respect to those of ordinary skill in the art, various variations and modifications can be made without departing from the spirit and the substance of this invention. These variations and modifications are also considered to fall in the scope protected by this invention.

What is claimed is:

1. A manufacturing method of an array substrate comprising a plurality of sub-pixel zones, wherein the manufacturing method comprises:

forming a light-emitting unit above a base substrate in each of the sub-pixel zones, wherein the light-emitting unit is formed to comprise a concave structure, so that the light-emitting area of the light-emitting unit is greater than the projected area of the light-emitting unit onto the base substrate, wherein the manufacturing method further comprises steps performed before the step of forming a light-emitting unit above a base substrate in each of the sub-pixel zones:

forming a planarizing layer above a base substrate; and forming a recess in a portion on the planarizing layer corresponding to the light-emitting unit, wherein a portion of the planarizing layer located around the recess has a thickness in a range of 5-7 μm, wherein the step of forming a recess in a portion on the planarizing layer corresponding to the light-emitting unit comprises: exposing and developing the planarizing layer by using a half-tone mask plate, wherein the half-tone mask plate comprises a fully light-transmitting zone, a partially light-transmitting zone, and an opaque zone, and the fully light-transmitting zone corresponds to the middle part of the light-emitting unit, the partially light-transmitting zone corresponds to the peripheral zone of the middle part of the light-emitting unit, and the opaque zone corresponds to the zone where the light-emitting unit is not provided, wherein the light transmittance of the partially light-transmitting zone is reduced gradually from interior to exterior.

2. The manufacturing method according to claim 1, wherein the step of forming a light-emitting unit above a base substrate in each of the sub-pixel zones comprises:

sequentially forming a first electrode, a light-emitting layer, and a second electrode on the surface of the recess on the planarizing layer;

wherein the first electrode comprises an opaque metal layer and the second electrode is a semitransparent metal layer.

3. The manufacturing method according to claim 2, wherein the manufacturing method further comprises a step performed before the step of forming a planarizing layer above a base substrate:

forming a driver thin film transistor above a base substrate; and the manufacturing method further comprises a step performed after the step of forming a planarizing layer above a base substrate:

forming a via hole in a position of the planarizing layer corresponding to a drain electrode of the driver thin film transistor, so that the first electrode is connected to the drain electrode through the via hole.

4. The manufacturing method according to claim 1, wherein an intersection angle between the side surface and the bottom surface of the recess is in a range of 130°-140°.

* * * * *